US012777868B2

(12) United States Patent
Nakamura et al.

(10) Patent No.: US 12,777,868 B2
(45) Date of Patent: Oct. 27, 2026

(54) METHOD OF PROCESSING STACKED WAFER

(71) Applicant: DISCO CORPORATION, Tokyo (JP)

(72) Inventors: Masaru Nakamura, Tokyo (JP); Takenori Takaya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1076 days.

(21) Appl. No.: 17/653,773

(22) Filed: Mar. 7, 2022

(65) Prior Publication Data

US 2022/0301934 A1 Sep. 22, 2022

(30) Foreign Application Priority Data

Mar. 22, 2021 (JP) ................................ 2021-047093

(51) Int. Cl.
*H10P 54/00* (2026.01)
*H10P 52/00* (2026.01)
*H10P 72/70* (2026.01)

(52) U.S. Cl.
CPC .............. *H10P 54/00* (2026.01); *H10P 52/00* (2026.01); *H10P 72/7402* (2026.01)

(58) Field of Classification Search
CPC ... H01L 21/78; H01L 21/304; H01L 21/6836; H01L 25/50; H01L 2221/68327; H01L 2221/68386; H01L 21/187; H01L 2221/68318; H01L 2221/68381; B24B 7/228; B23K 26/00; B23K 26/38; B23K 2103/50; B23K 26/53; C09J 7/241; C09J 2203/326
See application file for complete search history.

(56) References Cited

U.S. PATENT DOCUMENTS

2019/0393089 A1 12/2019 Zhao

FOREIGN PATENT DOCUMENTS

| | | | | | |
|---|---|---|---|---|---|
| DE | 102010030339 | A1 | * | 12/2010 | ......... B23K 26/0876 |
| JP | 2010103328 | A | | 5/2010 | |
| JP | 2011009562 | A | | 1/2011 | |
| JP | 2015230971 | A | | 12/2015 | |
| JP | 2016225549 | A | * | 12/2016 | |

(Continued)

OTHER PUBLICATIONS

Japanese Patent Application [JP 2021-047093 A]: English translation of Notice of Reasons for Refusal, Dec. 6, 2024 (# pages).

(Continued)

*Primary Examiner* — Bradley Smith
(74) *Attorney, Agent, or Firm* — Greer, Burns & Crain, Ltd

(57) ABSTRACT

A method of processing a stacked wafer including a first wafer and a second wafer stacked on a face side of the first wafer, includes positioning a focused spot of a laser beam inside the second wafer inwardly of two sides defining projected dicing lines, and applying the laser beam to the second wafer from an upper surface of the second wafer, thereby forming at least two strips of modified layers inside the second wafer along the projected dicing lines. A tape is affixed to the upper surface of the second wafer, and a projected dicing line is exposed by peeling off the tape from the upper surface of the second wafer to remove residuals of the second wafer that correspond to the projected dicing lines, thereby exposing the projected dicing lines on the face side of the first wafer.

13 Claims, 5 Drawing Sheets

(56) References Cited

FOREIGN PATENT DOCUMENTS

| | | | | | |
|---|---|---|---|---|---|
| JP | 2017005158 | A | | 1/2017 | |
| JP | 2019071475 | A | * | 5/2019 | |
| JP | 2019220657 | A | | 12/2019 | |
| JP | 2020057709 | A | | 4/2020 | |
| JP | 2020129032 | A | | 8/2020 | |
| KR | 20200130308 | A | * | 11/2020 | |
| TW | 201030833 | A | * | 8/2010 | ............. H01L 21/78 |

OTHER PUBLICATIONS

Office Action issued in counterpart German patent application No. 10 2022 202 492.3, dated Jun. 12, 2024.

* cited by examiner

METHOD OF PROCESSING STACKED WAFER

BACKGROUND OF THE INVENTION

Field of the Invention

The present invention relates to a method of processing a stacked wafer including a first wafer and a second wafer stacked on a face side of the first wafer, the first wafer having a plurality of devices formed in respective areas on the face side that are demarcated by a plurality of intersecting projected dicing lines.

Description of the Related Art

Wafers having a plurality of devices such as integrated circuits (ICs) and large-scale integrations (LSIs) formed in respective areas demarcated on face sides thereof by a plurality of intersecting projected dicing lines are divided into individual device chips by a dicing apparatus or a laser processing apparatus. The produced device chips will be used in electric equipment such as mobile phones and personal computers.

Stacked wafers such as silicon on insulator (SOI) wafers that include a first wafer and a second wafer stacked on the face side of the first wafer, the first wafer having a plurality of devices formed in respective areas on the face side that are demarcated by a plurality of intersecting projected dicing lines, are also divided along the projected dicing lines into individual two-layer device chips (see, for example, JP 2015-230971 A).

SUMMARY OF THE INVENTION

Upon processing such a stacked wafer described above, there may be performed a processing step of removing regions of the second wafer that correspond to the respective projected dicing lines and exposing the projected dicing lines on the face side of the first wafer. If the regions of the second wafer that correspond to the respective projected dicing lines are removed by a cutting blade, then the cutting blade may possibly contact the first wafer, tending to lower the quality of the first wafer. One solution would be to adjust the depth by which the cutting blade cuts into the second wafer in order to keep the cutting blade out of contact with the first wafer while the cutting blade is removing the regions of the second wafer. However, it is extremely difficult in reality to perform the cutting blade adjustment task. Another problem is that, when the cutting blade cuts the second wafer, cutting water, i.e., water supplied to the cutting blade during the cutting step, is liable to find its way through cut grooves in the second wafer to the first wafer, lowering the quality of the devices on the first wafer.

It is therefore an object of the present invention to provide a method of processing a stacked wafer including a first wafer and a second wafer stacked on the face side of the first wafer, without reducing the quality of the first wafer when the regions of the second wafer that correspond to respective projected dicing lines are removed and the projected dicing lines on the face side of the first wafer are exposed.

In accordance with an aspect of the present invention, there is provided a method of processing a stacked wafer including a first wafer and a second wafer stacked on a face side of the first wafer, the first wafer having a plurality of devices formed in respective areas on the face side that are demarcated by a plurality of intersecting projected dicing lines, the method including a modified layer forming step of positioning a focused spot of a laser beam having a wavelength transmittable through the second wafer inside the second wafer inwardly of two sides defining each of the projected dicing lines, and applying the laser beam to the second wafer from an upper surface of the second wafer, thereby forming at least two strips of modified layers inside the second wafer along the projected dicing lines, a tape affixing step of affixing a tape to the upper surface of the second wafer, and a projected dicing line exposing step of peeling off the tape from the upper surface of the second wafer to remove residuals of the second wafer that correspond to the projected dicing lines and in which the modified layers are formed along the projected dicing lines from the second wafer, thereby exposing the projected dicing lines formed on the face side of the first wafer.

Preferably, the tape affixing step includes an ultraviolet-curable tape affixing step of affixing an ultraviolet-curable tape whose adhesive power is lowered upon exposure to an ultraviolet radiation to the upper surface of the second wafer, and an ultraviolet radiation applying step of applying an ultraviolet radiation to other regions of the ultraviolet-curable tape than regions thereof corresponding to the projected dicing lines, thereby reducing adhesive power of the ultraviolet-curable tape in the other regions. Preferably, the tape used in the tape affixing step includes a thermocompression bonding tape containing polyolefin, and the tape affixing step includes a step of affixing the thermocompression bonding tape to the upper surface of the second wafer by heating and pressing the thermocompression bonding tape laid on the upper surface of the second wafer.

A thinning step of thinning the second wafer by grinding or polishing the upper surface of the second wafer may be carried out before the modified layer forming step or after the modified layer forming step.

In the method of processing a stacked wafer according to the present invention, the regions corresponding to the projected dicing lines of the first wafer can be removed from the second wafer without using a cutting blade. Therefore, the first wafer is prevented from suffering a reduced quality that would be caused by a cutting blade contacting the first wafer. Moreover, inasmuch as cutting water is not used to remove the regions of the second wafer that correspond to the projected dicing lines of the first wafer, the first wafer is prevented from suffering a reduced quality that would be caused by the cutting water.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A method of processing a stacked wafer, also referred to as "processing method," according to preferred embodiments of the present invention will be described in detail hereinbelow with reference to the accompanying drawings.

Figure 1:
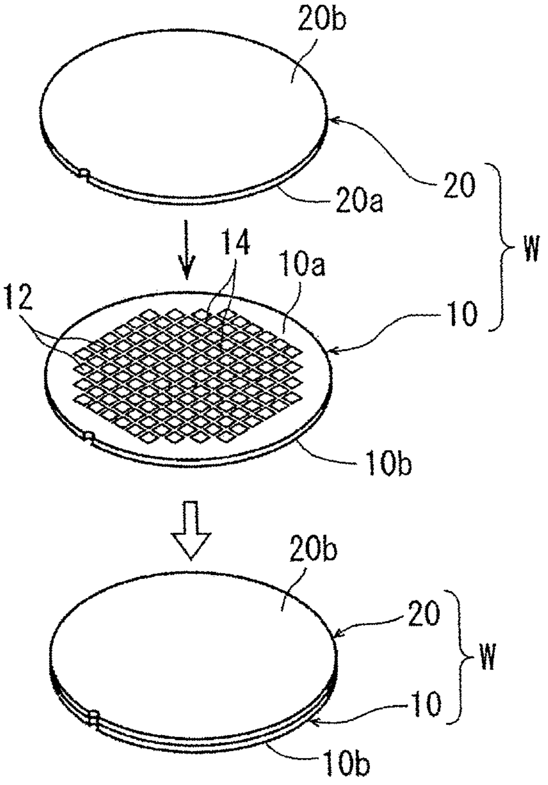
FIG. 1 is an exploded perspective view of a stacked wafer as a workpiece to be processed by a processing method according to an embodiment of the present invention.

FIG. 1 illustrates in exploded perspective a stacked wafer W as a workpiece to be processed by a processing method according to an embodiment of the present invention. As illustrated in an upper section of FIG. 1, the stacked wafer W includes a first wafer 10 and a second wafer 20 stacked on the first wafer 10. The first wafer 10 includes a wafer of silicon, for example, and has a face side 10*a*, facing upwardly, having a plurality of devices 12 formed in respective areas demarcated on the face side 10*a* by a plurality of intersecting projected dicing lines 14. Similarly to the first wafer 10, the second wafer 20 includes a wafer of silicon, for example, and has a face side 20*a*, facing downwardly, having a plurality of devices, not depicted, formed in respective areas demarcated on the face side 20*a* by a plurality of intersecting projected dicing lines, not depicted. The second wafer 20 is stacked on the first wafer 10 such that the face side 20*a* of the second wafer 20 faces the face side 10*a* of the first wafer 10, and the first and the second wafers 10 and 20 are integrally affixed to each other, providing the stacked wafer W as illustrated in a lower section of FIG. 1.

The projected dicing lines 14 on the face side 10*a* of the first wafer 10 and the projected dicing lines on the face side 20*a* of the second wafer 20 are formed in corresponding positions, i.e., are aligned with each other across the stacked wafer W. For integrally combining the first wafer 10 and the second wafer 20 with each other, their orientations are adjusted by aligning notches defined respectively in them, and the first wafer 10 and the second wafer 20 are affixed to each other (see the lower section of FIG. 1). Therefore, the first wafer 10 and the second wafer 20 are stacked one on the other and integrally combined together so as to keep the projected dicing lines 14 on the first wafer 10 and the projected dicing lines on the second wafer 20 in full alignment with each other. An oxide film or the like is interposed between the first wafer 10 and the second wafer 20, thereby firmly combining the first wafer 10 and the second wafer 20 integrally with each other. As described above, when the stacked wafer W to be processed according to the present embodiment has been prepared, the processing method to be described below is performed on the stacked wafer W.

For performing the processing method on the stacked wafer W according to the present embodiment, a thinning step may be carried out in advance to grind or polish the upper surface of the second wafer 20, i.e., a reverse side 20*b* of the second wafer 20, thereby thinning down the second wafer 20. The thinning step will be described below with reference to FIG. 2.

Figure 2:
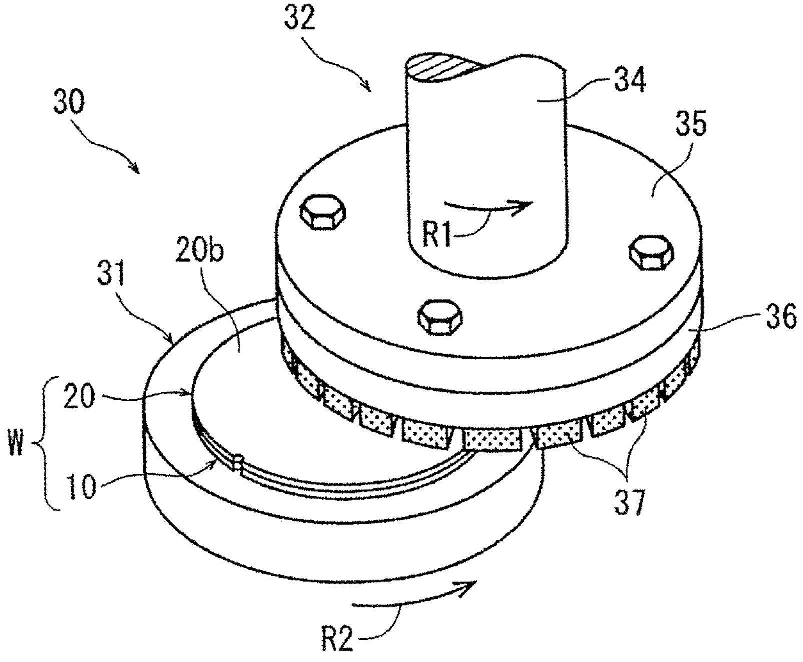
FIG. 2 is a perspective view illustrating a thinning step of the processing method.

FIG. 2 illustrates a grinding apparatus 30 that is used to carry out the thinning step, the grinding apparatus 30 being illustrated only partly. The grinding apparatus 30 includes a holding unit 31 for holding the stacked wafer W and a grinding unit 32 for grinding the stacked wafer W held on the holding unit 31.

The holding unit 31 includes a holding surface, omitted from illustration, which is permeable to air, and is connected to a suction source, also omitted from illustration, for example. The holding surface can hold the stacked wafer W thereon under suction forces transmitted from the suction source. The grinding unit 32 includes a rotary spindle 34 rotatable about its central axis by a rotational driving mechanism, not depicted, a wheel mount 35 mounted on a lower end of the rotary spindle 34, and a grinding wheel 36 attached to a lower surface of the wheel mount 35. A plurality of grindstones 37 are disposed in an annular array on a lower surface of the grinding wheel 36.

The grinding apparatus 30 carries out the thinning step as follows: A stacked wafer W to be ground is delivered to the grinding apparatus 30 where the stacked wafer W with the first wafer 10 facing downwardly is held under suction on the holding unit 31. Then, as depicted in the figure, the stacked wafer W is positioned below the grinding unit 32. The grinding unit 32 rotates the rotary spindle 34 about its central axis in a direction indicated by an arrow R1 at a speed of 6000 rpm, for example. At the same time, the holding unit 31 is rotated about its central axis in a direction indicated by an arrow R2 at a speed of 300 rpm, for example. While grinding water is being supplied from grinding water supply means, not depicted, to the reverse side 20*b* of the second wafer 20, the grinding wheel 36 is grinding-fed downwardly at a grinding feed speed of 1 μm/second, for example, continuously grinding the reverse side 20*b* of the second wafer 20 in such a state that the grindstones 37 are abrasive contact with the reverse side 20*b* of the second wafer 20. At this time, a contact-type measuring gage, not depicted, keeps measuring the thickness of the stacked wafer W. When the grindstones 37 have ground the reverse side 20*b* of the second wafer 20 of the stacked wafer W by a predetermined depth, the grinding unit 32 stops grinding the stacked wafer W. If necessary, the stacked wafer W that has been ground is cleaned and dried, whereupon the thinning step is completed.

In a case where an amount to thin down the reverse side 20*b* of the second wafer 20 is small or the reverse side 20*b* of the second wafer 20 needs to be polished to a mirror finish in the thinning step described above, the grinding unit 32 may be replaced or combined with a polishing apparatus, not depicted, for polishing and thinning down the reverse side 20*b* of the second wafer 20 with a polishing pad or the like. Alternatively, in a case where the second wafer 20 of the stacked wafer W has already been of a desired thickness at a time at which the stacked wafer W is fabricated, the thinning step described above may be omitted.

The stacked wafer W thus prepared from the thinning step or without the thinning step is then processed in a modified layer forming step to be described below. For carrying out the modified layer forming step, as illustrated in FIG. 3, the stacked wafer W is held on an annular frame F by an adhesive tape T1 and delivered to a laser processing apparatus 1.

Figure 3:
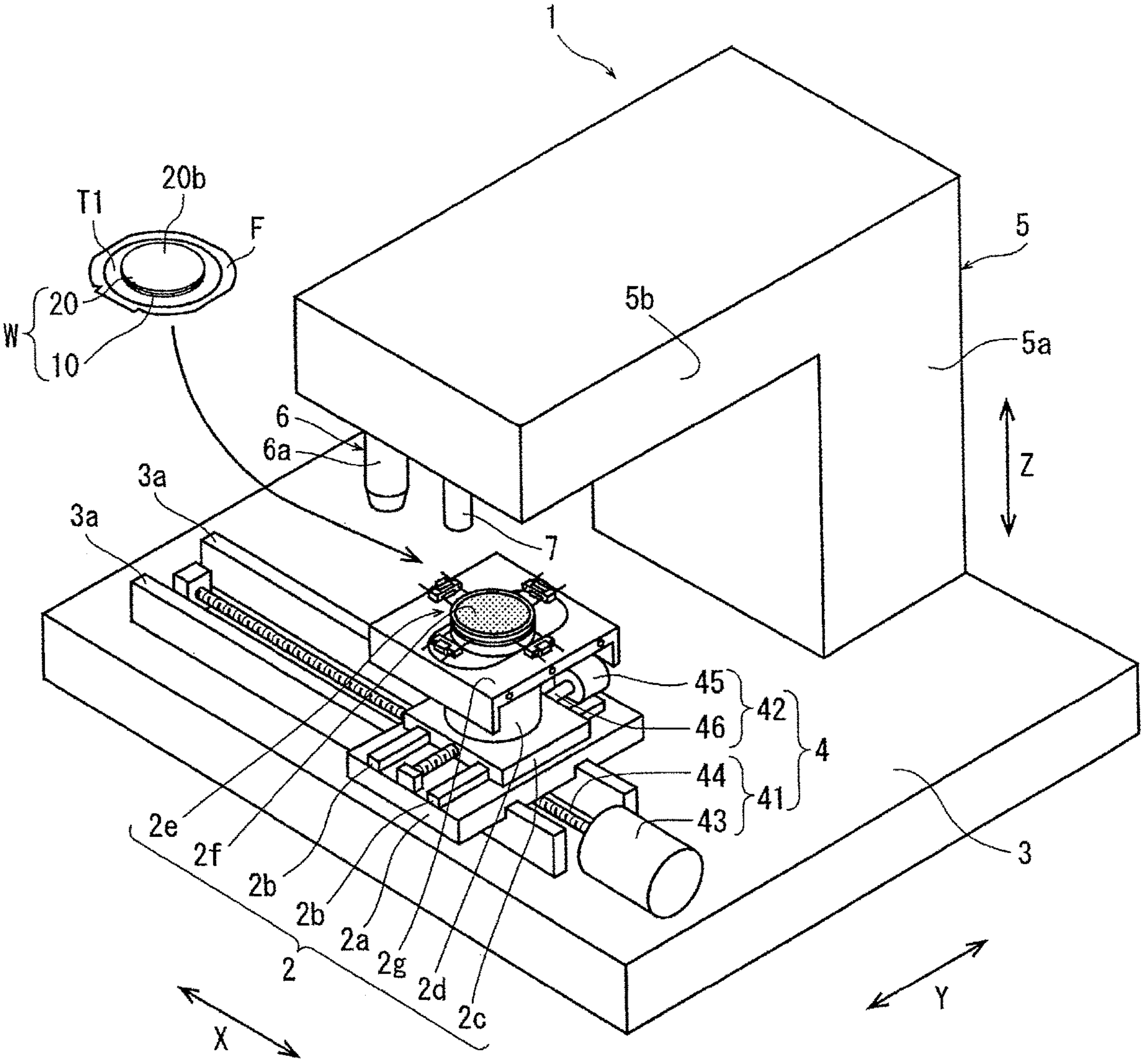
FIG. 3 is a perspective view of a laser processing apparatus.

FIG. 3 illustrates in perspective the laser processing apparatus 1 in its entirety that is suitable for carrying out the processing method according to the present embodiment. The laser processing apparatus 1 includes a holding unit 2, a base 3, a moving mechanism 4, a laser beam applying unit 6, an image capturing unit 7, and a control unit, not depicted.

The holding unit 2 includes a rectangular X-axis movable plate 2*a* movably mounted on the base 3 for movement in X-axis directions, a rectangular Y-axis movable plate 2*c* movably mounted on the X-axis movable plate 2*a* for movement in Y-axis directions along a pair of guide rails 2*b* on the X-axis movable plate 2*a*, a hollow cylindrical post 2*d* fixed to an upper surface of the Y-axis movable plate 2*c*, and a rectangular cover plate 2*g* fixed to an upper end of the post 2*d*. The holding unit 2 also includes a chuck table 2*e* including a circular member mounted on the cover plate 2*g* and extending upwardly through an oblong hole defined in the cover plate 2*g*. The chuck table 2*e* is rotatable about its central axis by rotational driving means, not depicted. The chuck table 2*e* has a holding surface 2*f* made of an air-permeable porous material and lying in a plane defined by the X-axis directions and the Y-axis directions. The holding surface 2*f* is connected to suction means, not depicted, through a fluid channel defined in and extending through the post 2*d*. In FIG. 3, the X-axis directions are represented by the directions indicated by an arrow X and the Y-axis directions are represented by the directions indicated by an arrow Y and perpendicular to the X-axis directions. The plane defined by the X-axis directions and the Y-axis directions is essentially horizontal.

The moving mechanism 4 includes an X-axis moving mechanism 41 for moving the chuck table 2*e* of the holding unit 2 and the laser beam applying unit 6 and the image capturing unit 7 relatively to each other along the X-axis directions, and a Y-axis moving mechanism 42 for moving the chuck table 2*e* of the holding unit 2 and the image capturing unit 7 relatively to each other along the Y-axis directions. The X-axis moving mechanism 41 includes a ball screw 44 extending in the X-axis directions over the base 3 and an electric motor 43 coupled to an end of the ball screw 44. The ball screw 44 is operatively threaded through a nut, not depicted, fixed to a lower surface of the X-axis movable plate 2*a*. The X-axis moving mechanism 41 converts rotary motion of the electric motor 43 into linear motion through the ball screw 44 and the nut combined therewith, and transmits the linear motion to the X-axis movable plate 2*a*, moving the X-axis movable plate 2*a* back and forth in the X-axis directions along a pair of guide rails 3*a* mounted on the base 3. The Y-axis moving mechanism 42 includes a ball screw 46 extending in the Y-axis directions over the X-axis movable plate 2*a* and an electric motor 45 coupled to an end of the ball screw 46. The ball screw 46 is operatively threaded through a nut, not depicted, fixed to a lower surface of the Y-axis movable plate 2*c*. The Y-axis moving mechanism 42 converts rotary motion of the electric motor 45 into linear motion through the ball screw 46 and the nut combined therewith, and transmits the linear motion to the Y-axis movable plate 2*c*, moving the Y-axis movable plate 2*c* back and forth in the Y-axis directions along the guide rails 2*b* mounted on the X-axis movable plate 2*a*.

A frame 5 including a vertical wall 5*a* extending upwardly from an upper surface of the base 3 and a horizontal arm 5*b* extending horizontally from the vertical wall 5*a* in overhanging relation to the holding unit 2 is erected from the base 3 behind the holding unit 2. The laser beam applying unit 6 and the image capturing unit 7 have respective optical systems housed in the horizontal arm 5*b*. The laser beam applying unit 6 includes a beam condenser 6*a* disposed on a lower surface of a distal end portion of the horizontal arm 5*b*. The image capturing unit 7 includes a lens assembly disposed on the lower surface of the distal end portion of the horizontal arm 5*b* at a position spaced from the beam condenser 6*a* in the X-axis directions. The image capturing unit 7 also includes illuminating means for emitting visible light and an ordinary image capturing element for capturing visible light, as well as infrared radiation emitting means for emitting an infrared radiation and an infrared image capturing element for capturing an infrared radiation. The laser beam applying unit 6, the moving mechanism 4, the image capturing unit 7, and the like are electrically connected to the control unit, not depicted, and perform laser processing on a workpiece on the chuck table 2*e* according to instruction signals supplied from the control unit.

The stacked wafer W delivered to the laser processing apparatus 1 is placed on the chuck table 2*e* of the holding unit 2 with the reverse side 20*b* of the second wafer 20 facing upwardly and held under suction on the holding surface 2*f* under suction with the adhesive tape T1 interposed therebetween. The stacked wafer W on the chuck table 2*e* is moved by the moving mechanism 4 and positioned directly below the image capturing unit 7 so as to be processed in an alignment step. In the alignment step, the image capturing unit 7 captures an image of the first wafer 10 of the stacked wafer W from the reverse side 20*b* of the second wafer 20 and detects the positions of the projected dicing lines 14 on the face side 10*a* of the first wafer 10. Then, the rotational driving means described above turns the chuck table 2*e* about its central axis to align a first group of projected dicing lines 14 oriented in a first direction among all the projected dicing lines 14 with the X-axis directions on the basis of the detected positional information of the projected dicing lines 14. As described above, the first wafer 10 and the second wafer 20 are stacked one on the other such that the projected dicing lines 14 on the face side 10*a* of the first wafer 10 and the projected dicing lines, not depicted, on the face side 20*a* of the second wafer 20 are aligned with each other across the stacked wafer W. In the alignment step, therefore, the projected dicing lines of the second wafer 20 are also aligned with the X-axis directions at the same time that the projected dicing lines 14 of the first wafer 10 are aligned with the X-axis directions. The positional information of the projected dicing lines 14 that is detected in the alignment step is stored in the non-illustrated control unit.

Figure 4A:
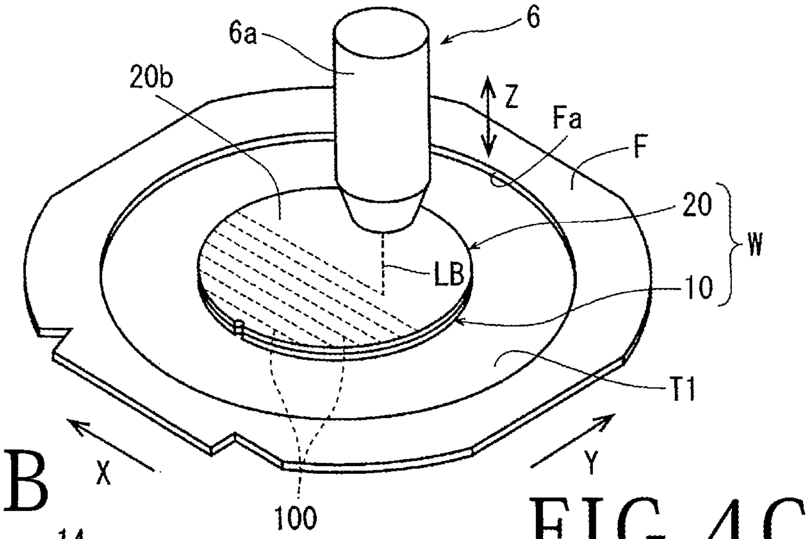
FIG. 4A is a perspective view illustrating a modified layer forming step of the processing method.

On the basis of the positional information detected in the alignment step described above, the beam condenser 6*a* of the laser beam applying unit 6 is positioned above a processing start position corresponding to a predetermined one of the projected dicing lines 14. Then, as indicated in FIG. 4A, the modified layer forming step is performed on the stacked wafer W to apply a laser beam LB having a wavelength transmittable through the second wafer 20 to the second wafer 20 to form modified layers 100 in the second wafer 20. The modified layer forming step will be described in specific detail below with reference to FIGS. 4A through 4C.

Figure 4B:
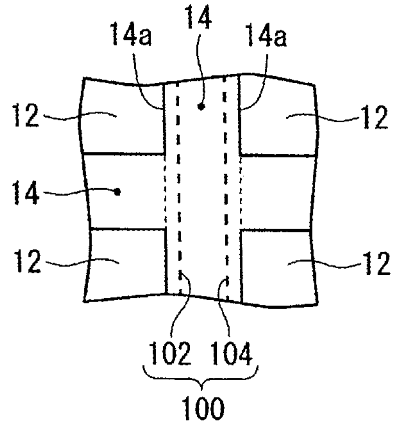
FIG. 4B is an enlarged fragmentary plan view of a first wafer.
Figure 4C:
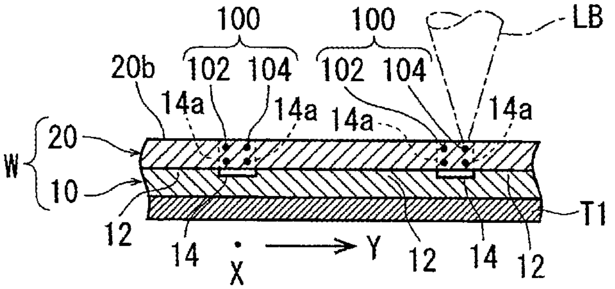
FIG. 4C is an enlarged fragmentary cross-sectional view of the stacked wafer in the modified layer forming step.

In the modified layer forming step according to the present embodiment, as indicated in FIG. 4B, the laser beam LB has its focused spot positioned inside the second wafer 20 in a region sandwiched between two sides 14*a* of adjacent two devices 12 that define one of the projected dicing lines 14 on the first wafer 10 as viewed in plan. The chuck table 2*e* and hence the stacked wafer W are processing-fed in one of the X-axis directions, i.e., the direction indicated by X in FIG. 4A. The laser beam LB now forms modified layers 100 inside the second wafer 20 along the projected dicing line 14 of the stacked wafer W. According to the present embodiment, furthermore, the laser beam LB whose focused spot is positioned inside the second wafer 20 in the region sandwiched between two sides 14*a* forms at least two strips of modified layers 102 and 104 along the two sides 14*a*. These modified layers 102 and 104 jointly make up the modified layers 100. According to the present embodiment, as illustrated in FIG. 4C, the laser beam LB forms the modified layers 102 and 104 in a plurality of positions at different depths in the second wafer 20.

After the laser beam LB has formed the modified layers 100 including the two strips of modified layers 102 and 104 inside the second wafer 20 in the region corresponding to the projected dicing line 14 along the X-axis directions, the moving mechanism 4 described above is actuated to indexing-feed the stacked wafer W in one of the Y-axis directions to position a region of the second wafer 20 that corresponds to an unprocessed projected dicing line 14 that is adjacent to the projected dicing line 14 already processed, directly below the beam condenser 6*a*. Then, the laser beam LB has its focused spot positioned inside the second wafer 20 in the region corresponding to the unprocessed projected dicing line 14, and the stacked wafer W is processing-fed in one of the X-axis directions, forming modified layers 100 including two strips of modified layers 102 and 104, in the same manner as described above. Thereafter, the stacked wafer W is processing-fed in one of the X-axis directions and indexing-fed in one of the Y-axis directions, and the laser beam LB is applied to the stacked wafer W until modified layers 100 are formed inside the second wafer 20 along all of the projected dicing lines 14 of the first group along the X-axis directions. Then, the stacked wafer W is turned 90° about its central axis together with the chuck table 2*e* to align a second group of projected dicing lines 14 oriented in a second direction perpendicular to the first direction in which the modified layers 100 described above have already been formed with the X-axis directions. Then, the laser beam LB has its focused spot positioned inside the second wafer 20 in the region corresponding to each of the unprocessed projected dicing lines 14 of the second group, and the stacked wafer W is processing-fed in one of the X-axis directions, forming modified layers 100 including two strips of modified layers 102 and 104, in the same manner as described above. Thereafter, the stacked wafer W is processing-fed in one of the X-axis directions and indexing-fed in one of the Y-axis directions, and the laser beam LB is applied to the stacked wafer W until modified layers 100 are formed inside the second wafer 20 along all of the projected dicing lines 14 of the second group along the X-axis directions. The modified layer forming step is now completed.

Laser processing conditions in the modified layer forming step described above are established as follows, for example:

Wavelength: 1064 nm
Average output power: 1.0 W
Repetitive frequency: 100 kHz
Processing-feed speed: 100 mm/second In the modified layer forming step according to the present embodiment described above, the laser beam LB has its focused spot positioned inside the second wafer 20 inwardly of the two sides 14*a* that define each of the projected dicing lines 14 of the first wafer 10 and is applied from the upper surface, i.e., the reverse side 20*b*, of the second wafer 20 to the second wafer 20, forming the modified layers 100 including the two strips of modified layers 102 and 104 in the second wafer 20 along the projected dicing line 14. The present invention is not limited to the formation of such modified layers. For example, modified layers including three or more strips of modified layers may be formed in the second wafer 20.

Figure 5:
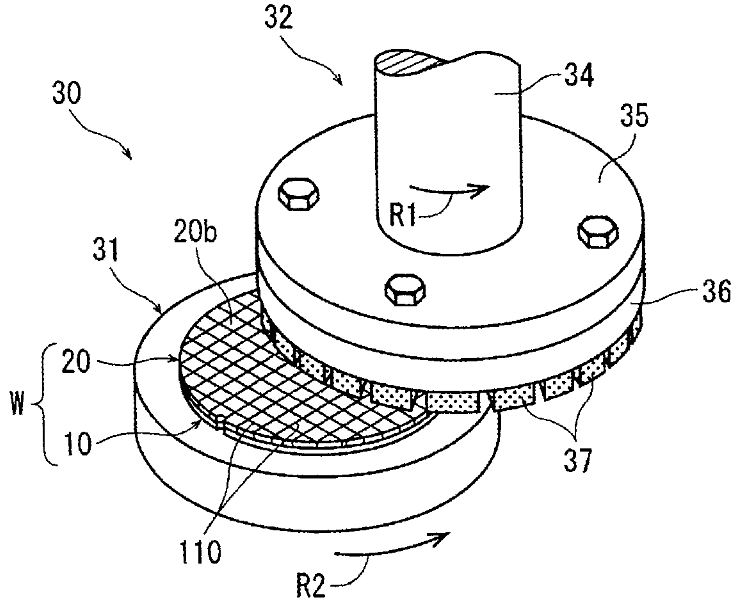
FIG. 5 is a perspective view illustrating an alternative thinning step of the processing method.

According to the present embodiment described above, the thinning step of thinning down the reverse side 20*b* of the second wafer 20 is carried out before the modified layer forming step is performed. However, the present invention is not limited to such details. The thinning step may be carried out after the modified layer forming step described above is performed. For example, as illustrated in FIG. 5, the stacked wafer W on which the modified layer forming step has been performed is delivered to the grinding apparatus 30 that grinds and/or polishes the reverse side 20*b* of the second wafer 20 until the second wafer 20 is thinned down to a desired thickness through the same procedure as the thinning step described above. When the thinning step is carried out after the modified layer forming step is performed, external forces are exerted to the regions where the modified layers 100 are formed, dividing the second wafer 20 along the modified layers 100, i.e., the modified layers 102 and 104 thereby to form fractured regions 110 in the second wafer 20. Since the regions divided along the modified layers 100 by the thinning step are extremely narrow, the grinding water supplied when the reverse side 20*b* of the second wafer 20 is ground does not find its way toward the first wafer 10. The present embodiment will further be described below on the assumption that the thinning step described above is carried out before the modified layer forming step is performed.

Figure 6:
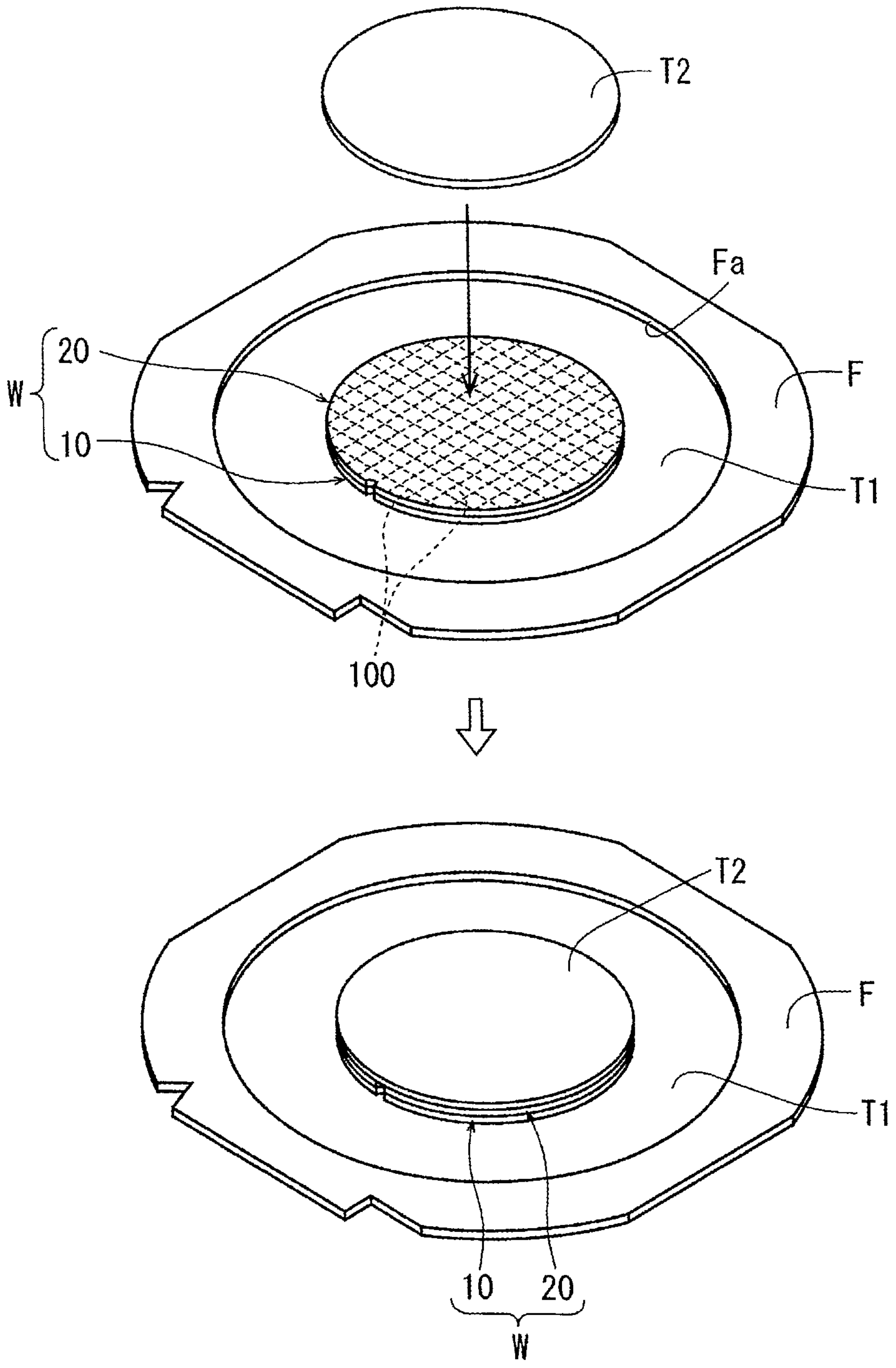
FIG. 6 is a perspective view illustrating an affixing step of affixing an ultraviolet-curable tape in a tape affixing process of the processing method.

When the modified layer forming step described above has been performed, a tape affixing step is carried out to affix a tape having adhesive power to the upper surface, i.e., the reverse side 20*b*, of the second wafer 20. For carrying out the tape affixing step, a tape T2 (see FIG. 6) that is of substantially the same dimensions as the stacked wafer W as viewed in plan is prepared. The tape T2 to be affixed to the second wafer 20 is not limited to any particular tapes. According to the present embodiment, an ultraviolet-curable tape that lowers its adhesive power and is hardened upon exposure to an ultraviolet radiation is selected as the tape T2. For example, the ultraviolet-curable tape can include a base member made of polyvinyl chloride (PVC). When the tape T2 has been prepared, an ultraviolet-curable tape affixing step is carried out to affix the tape T2 to the reverse side 20*b* of the second wafer 20 of the stacked wafer W in which the modified layers 100 have been formed, so as to achieve an integral form, as illustrated in FIG. 6.

Figure 7:
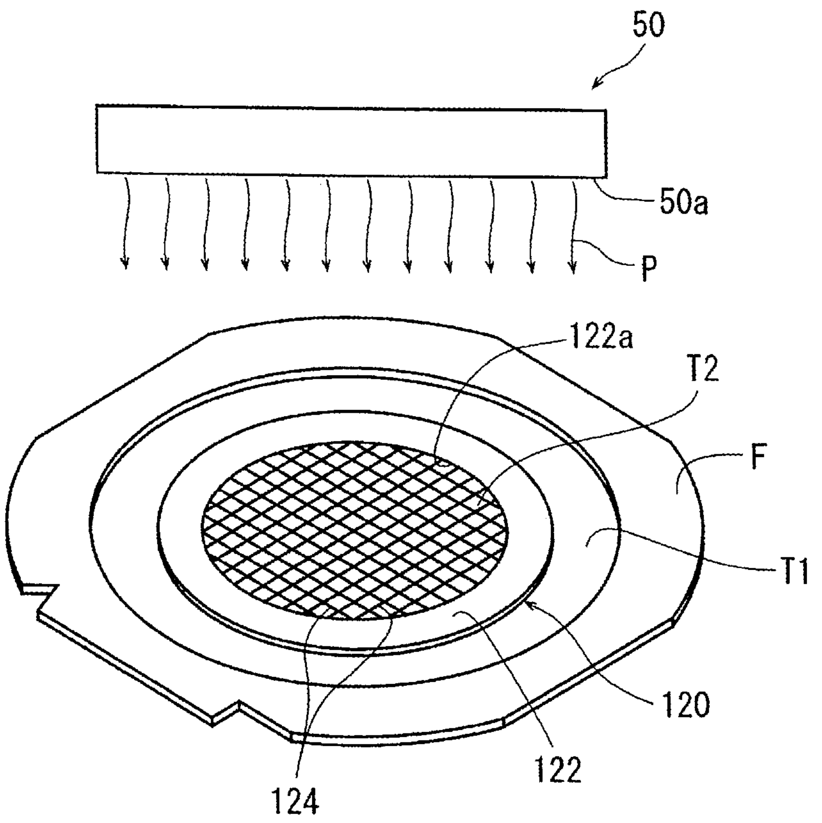
FIG. 7 is a perspective view illustrating an ultraviolet ray applying step in the tape affixing process.

In a case where an ultraviolet-curable tape is used as the tape T2 described above, it is preferable to carry out an ultraviolet radiation applying step as illustrated in FIG. 7. The ultraviolet-curable tape affixing step and the ultraviolet radiation applying step are included in the tape affixing step.

For performing the ultraviolet radiation applying step, as illustrated in FIG. 7, a mask 120 is placed over the tape T2 on the stacked wafer W held by the adhesive tape T1. The mask 120 includes an annular frame 122 having an opening 122*a* defined therein that is complementary in shape to the stacked wafer W and a grid 124 that masks the regions of the tape T2 affixed to the stacked wafer W that correspond to the respective projected dicing lines 14. The grid 124 is attached to the annular frame 122 and positioned in the opening 122*a*. When the mask 120 is placed over the tape T2 on the stacked wafer W held by the adhesive tape T1, the regions of the tape T2 that correspond to the respective projected dicing lines 14 are masked by the grid 124 as viewed in plan. With the mask 120 placed on the adhesive tape T1 over the tape T2, an ultraviolet radiation applying apparatus 50 is positioned above the stacked wafer W and applies an ultraviolet radiation P from an ultraviolet radiation applying surface 50*a* thereof to at least the mask 120 in its entirety. The ultraviolet radiation P is applied to other regions of the tape T2 than those regions corresponding to the projected dicing lines 14, reducing the adhesive power of the other regions of the tape T2 than those regions corresponding to the projected dicing lines 14.

After the tape affixing step including the ultraviolet-curable tape affixing step and the ultraviolet radiation applying step has been carried out, a projected dicing line exposing step is carried out as described below.

Figure 8:
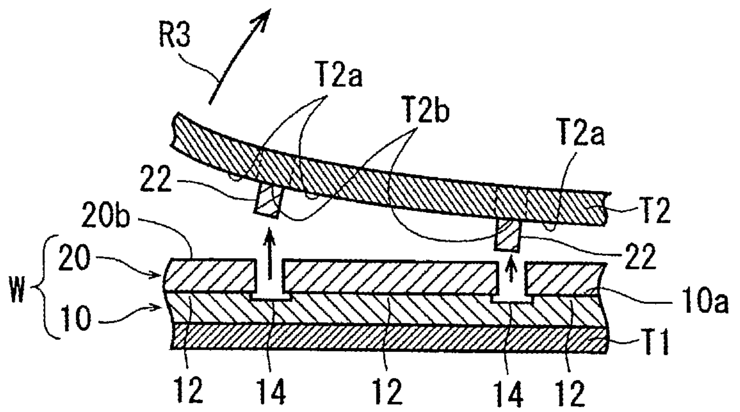
FIG. 8 is an enlarged fragmentary cross-sectional view illustrating a projected dicing line exposing step of the processing method.

As illustrated in FIG. 8, the projected dicing line exposing step is carried out by peeling off the tape T2 affixed to the reverse side 20*b* of the second wafer 20 of the stacked wafer W, upwardly in a direction indicated by an arrow R3. At this time, regions T2*a* of the tape T2 that have been exposed to the ultraviolet radiation in the ultraviolet radiation applying step have their adhesive power lowered and can easily be peeled off from the reverse side 20*b* of the second wafer 20. Conversely, in the ultraviolet radiation applying step described above, regions T2*b* of the tape T2 that have been masked by the grid 124 of the mask 120 have their adhesive power not lowered, but retained, and in addition, the regions of the second wafer 20 that correspond to the projected dicing lines 14 of the first wafer 10 each have the two strips of modified layers 102 and 104 as fracture initiating points. Therefore, regions of the second wafer 20 where the modified layers 102 and 104 are formed so as to correspond to the projected dicing lines 14 of the first wafer 10 remain stuck to the tape T2 and separated as residuals 22 from the second wafer 20 when the tape T2 is peeled off from the second wafer 20. As a result, the residuals 22 where the modified layers 102 and 104 are formed so as to correspond to the projected dicing lines 14 are removed from the second wafer 20, thereby exposing the projected dicing lines 14 on the face side 10*a* of the first wafer 10.

According to the present embodiment described above, in the method of processing the stacked wafer, the regions of the second wafer 20 that correspond to the projected dicing lines 14 of the first wafer 10 are separated as the residuals 22 from the second wafer 20 when the tape T2 is peeled off from the second wafer 20. Since the residuals 22 are removed from the second wafer 20 without using a cutting blade, the first wafer 10 is prevented from suffering a reduced quality that would be caused by a cutting blade contacting the first wafer 10. Moreover, inasmuch as cutting water is not used to remove the regions of the second wafer 20 that correspond to the projected dicing lines 14 of the first wafer 10, the first wafer 10 is also prevented from suffering a reduced quality that would be caused by the cutting water.

According to the present embodiment described above, an ultraviolet-curable tape is used as the tape T2 affixed to the second wafer 20 in the tape affixing step, and the ultraviolet-curable tape affixing step and the ultraviolet radiation applying step are carried out in the tape affixing step. However, the present invention is not limited to such details. Rather, a thermocompression bonding tape containing polyolefin may be used as the tape T2 laid on the upper surface of the second wafer 20 in the tape affixing step, and may be affixed to the upper surface of the second wafer 20 by being heated and pressed against the upper surface of the second wafer 20, for example. In this case, the tape affixing step is followed by peeling off the tape T2 from the upper surface, i.e., the reverse side 20*b*, of the second wafer 20 to remove the residuals 22 where the modified layers 102 and 104 are formed so as to correspond to the projected dicing lines 14 from the second wafer 20, thereby exposing the projected dicing lines 14 on the face side 10*a* of the first wafer 10.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a stacked wafer including a first wafer and a second wafer stacked on a face side of the first wafer, the first wafer having a plurality of devices formed in respective areas on the face side that are demarcated by a plurality of intersecting projected dicing lines, the method comprising:

a modified layer forming step of positioning a focused spot of a laser beam having a wavelength transmittable through the second wafer inside the second wafer inwardly of two sides defining each of the projected dicing lines, and applying the laser beam to the second wafer from an upper surface of the second wafer, thereby forming at least two strips of modified layers inside the second wafer along each of the projected dicing lines;

a tape affixing step of affixing a tape to the upper surface of the second wafer; and a projected dicing line exposing step of peeling off the tape from the upper surface of the second wafer to remove residuals of the second wafer that correspond to the projected dicing lines and in which the modified layers are formed along the projected dicing lines from the second wafer, thereby exposing the projected dicing lines formed on the face side of the first wafer.

2. The method of processing a stacked wafer according to claim 1, wherein the tape affixing step includes affixing an ultraviolet-curable tape whose adhesive power is lowered upon exposure to an ultraviolet radiation to the upper surface of the second wafer, and applying an ultraviolet radiation to other regions of the ultraviolet-curable tape than regions thereof corresponding to the projected dicing lines, thereby reducing adhesive power of the ultraviolet-curable tape in the other regions.

3. The method of processing a stacked wafer according to claim 1, wherein the tape used in the tape affixing step includes a thermocompression bonding tape containing polyolefin, and the tape affixing step includes a step of affixing the thermocompression bonding tape to the upper surface of the second wafer by heating and pressing the thermocompression bonding tape laid on the upper surface of the second wafer.

4. The method of processing a stacked wafer according to claim 1, further comprising:

a thinning step of thinning the second wafer.

5. The method of processing a stacked wafer according to claim 1, further comprising:

after the modified layer forming step, a thinning step of thinning the second wafer by grinding or polishing the upper surface of the second wafer.

6. The method of processing a stacked wafer according to claim 1, wherein prior to performing the modified layer forming step, grinding the second wafer stacked on a face side of the first wafer to thin the second wafer.

7. A method of processing a stacked wafer including a first wafer and a second wafer stacked on a face side of the first wafer, the first wafer having a plurality of devices formed in respective areas on the face side that are demarcated by a plurality of intersecting projected dicing lines, the method comprising:

a modified layer forming step of positioning a focused spot of a laser beam having a wavelength transmittable through the second wafer inside the second wafer inwardly of two sides defining each of the projected dicing lines, and applying the laser beam to the second wafer from an upper surface of the second wafer, thereby forming at least two strips of modified layers inside the second wafer along each of the projected dicing lines;

a tape affixing step of affixing a tape to the upper surface of the second wafer; and a projected dicing line exposing step of peeling off the tape from the upper surface of the second wafer to remove residuals of the second wafer that correspond to the projected dicing lines and in which the modified layers are formed along the projected dicing lines from the second wafer, thereby exposing the projected dicing lines formed on the face side of the first wafer;

wherein each of the plurality of intersecting projected dicing lines extend parallel to a corresponding dicing line direction, and the two sides defining each of the projected dicing lines extends parallel to the corresponding dicing line direction, and wherein the at least two strips of modified layers formed inside the second wafer along each of the projected dicing lines are laterally spaced from each other in a lateral direction between the two sides of a corresponding projected dicing line, wherein the lateral direction is orthogonal to the corresponding dicing line direction and extends between the two sides of the corresponding projected dicing line.

8. The method of processing a stacked wafer according to claim 7, wherein the second wafer has a thickness direction and wherein at two least laterally spaced strips of modified layers are formed inside the second wafer along each of the projected dicing lines at a plurality of depths in the thickness direction.

9. The method of processing a stacked wafer according to claim 7, wherein the tape affixing step includes affixing an ultraviolet-curable tape whose adhesive power is lowered upon exposure to an ultraviolet radiation to the upper surface of the second wafer, and applying an ultraviolet radiation to other regions of the ultraviolet-curable tape than regions thereof corresponding to the projected dicing lines, thereby reducing adhesive power of the ultraviolet-curable tape in the other regions.

10. The method of processing a stacked wafer according to claim 7, wherein the tape used in the tape affixing step includes a thermocompression bonding tape containing polyolefin, and the tape affixing step includes a step of affixing the thermocompression bonding tape to the upper surface of the second wafer by heating and pressing the thermocompression bonding tape laid on the upper surface of the second wafer.

11. The method of processing a stacked wafer according to claim 7, further comprising:

a thinning step of thinning the second wafer.

12. The method of processing a stacked wafer according to claim 7, further comprising:

after the modified layer forming step, a thinning step of thinning the second wafer by grinding or polishing the upper surface of the second wafer.

13. The method of processing a stacked wafer according to claim 7, wherein prior to performing the modified layer forming step, grinding the second wafer stacked on a face side of the first wafer to thin the second wafer.

* * * * *